(12) United States Patent
Gronenborn et al.

(10) Patent No.: US 9,172,213 B2
(45) Date of Patent: Oct. 27, 2015

(54) VCSEL MODULE AND MANUFACTURE THEREOF

(71) Applicant: KONINKLIJKE PHILIPS N.V., Eindhoven (NL)

(72) Inventors: Stephan Gronenborn, Eindhoven (NL); Armand Pruijmboom, Eindhoven (NL); Raimond Louis Dumoulin, Eindhoven (NL); Michael Miller, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/382,793

(22) PCT Filed: Feb. 22, 2013

(86) PCT No.: PCT/IB2013/051448
§ 371 (c)(1),
(2) Date: Sep. 4, 2014

(87) PCT Pub. No.: WO2013/136205
PCT Pub. Date: Sep. 19, 2013

(65) Prior Publication Data
US 2015/0071320 A1  Mar. 12, 2015

Related U.S. Application Data

(60) Provisional application No. 61/610,557, filed on Mar. 14, 2012.

(51) Int. Cl.
*H01S 5/00* (2006.01)
*H01S 5/42* (2006.01)
(Continued)

(52) U.S. Cl.
CPC ............... *H01S 5/423* (2013.01); *H01S 5/005* (2013.01); *H01S 5/183* (2013.01); *H01S 5/4018* (2013.01);
(Continued)

(58) Field of Classification Search
CPC ... H01S 5/4025; H01S 5/02272; H01S 5/423; H01S 5/4087; H01S 5/005; H01S 5/4043; H01S 5/4018; H01S 5/02276; H01S 5/02252; H01S 5/02423; H01S 5/02476; H01S 5/0425
USPC .......................................... 372/50.124, 50.12
See application file for complete search history.

(56) References Cited

U.S. PATENT DOCUMENTS 7,358,109 B2  4/2008  Gallup et al.
7,564,887 B2  7/2009  Wang et al.
(Continued)

FOREIGN PATENT DOCUMENTS

WO  2011073886 A1  6/2011

*Primary Examiner* — Jessica Stultz
*Assistant Examiner* — Vu A Vu (57) ABSTRACT

The invention describes a method of manufacturing a VCSEL module (100) comprising at least one VCSEL chip (33) with an upper side (U) and a lower side (L) and with a plurality of VCSEL units (55) on a common carrier structure (35), the VCSEL units (55) comprising a first doped layer (50) of a first type facing towards the lower side (L) and a second doped layer (23) of a second type facing towards the upper side (U). The method comprises the steps of dividing the VCSEL chip (33) into a plurality of subarrays (39*a*, 39*b*, 39*c*, 39*d*, 39*e*, 39*f*, 39*g*, 39*h*, 39*i*) with at least one VCSEL unit (55) each, electrically connecting at least some of the subarrays (39*a*, 39*b*, 39*c*, 39*d*, 39*e*, 39*f*, 39*g*, 39*h*, 39*i*) in series. The invention also describes a VCSEL module (100) manufactured in such process.

10 Claims, 5 Drawing Sheets

(51) Int. Cl.
  *H01S 5/183*   (2006.01)
  *H01S 5/40*    (2006.01)
  *H01S 5/02*    (2006.01)
  *H01S 5/022*   (2006.01)

(52) U.S. Cl.
  CPC ............ *H01S 5/0216* (2013.01); *H01S 5/0217* (2013.01); *H01S 5/02288* (2013.01); *H01S 5/4025* (2013.01)

(56) References Cited

U.S. PATENT DOCUMENTS

| | | | |
|---|---|---|---|
| 7,960,195 B2 * | 6/2011 | Maeda et al. | 438/29 |
| 2003/0179800 A1 | 9/2003 | Uebbing | |
| 2008/0084905 A1 * | 4/2008 | Doerfel et al. | 372/43.01 |
| 2011/0044369 A1 * | 2/2011 | Andry et al. | 372/50.124 |
| 2011/0274131 A1 | 11/2011 | Takaki et al. | |
| 2012/0051384 A1 * | 3/2012 | Geske et al. | 372/50.124 |

\* cited by examiner

VCSEL MODULE AND MANUFACTURE THEREOF

CROSS-REFERENCE TO PRIOR APPLICATIONS

This application is the U.S. National Phase application under 35 U.S.C. §371 of International Application No. PCT/IB2013/051448, filed on Feb. 22, 2013, which claims the benefit of U.S. Patent Application No. 61/610,557, filed on Mar. 14, 2012. These applications are hereby incorporated by reference herein.

FIELD OF THE INVENTION

The invention describes a method of manufacturing a VCSEL module comprising at least one VCSEL chip with an upper side and a lower side and with a plurality of VCSEL units on a common carrier structure, the VCSEL units comprising a first doped layer of a first type facing towards the lower side and a second doped layer of a second type facing towards the upper side. It also describes such VCSEL module.

BACKGROUND OF THE INVENTION

VCSEL modules are comprised of a number (i.e. one or a plurality) of VCSEL chips (also called dies) which chips comprise at least one, usually a large number of VCSEL units. The larger these chips the less mounting time and thus mounting costs for the production of VCSEL modules needs to be spent. Therefore, it is particularly beneficial to use as large semiconductor chips in this context as possible as long as they can be soldered with a good quality. Firstly, larger chips reduce the amount of lost wafer area due to sawing lanes and rims of the chips. Secondly, fewer individual soldered steps, i.e. pick-and-place steps, are necessary. VCSEL chips currently have maximum sizes varying between 0.8 mm×0.8 mm up to 5 mm×5 mm.

The sizes of VCSEL chips are mainly limited by the current that runs through them. As the efficiency of VCSELs has improved enormously (even apart from the sizes of VCSEL chips), operational currents of 15 A in cw (continuous wave) operation and even 30 A in pulsed operation can be considered normal for a chip of the size of 4 mm². Larger chips, for instance, with a size of 9 mm² may result in currents well above 50 A. However, for a laser driver with a fixed electrical power of, for instance, 1000 W it is beneficial to operate at relatively moderate currents. In addition, the size of the electrical connections from such driver to the VCSEL module and inside of the VCSEL module scale up with the operation current and become more and more bulky, heavy, and inflexible.

For small VCSEL chips, the operation current and voltage can be tailored by connecting several chips in parallel and others in series. For larger chips however, the current is the limiting factor of size, because on the chip level all VCSEL units are operated in parallel. This implies that there is a certain limit of size to VCSEL chips inside VCSEL modules which limit also restricts the effectivity of mounting processes of the VCSEL chips.

Therefore, it is an object of the invention to provide for a possibility of more effectively providing a VCSEL module of the above-mentioned kind, in particular by overcoming the current limit of the size of the VCSEL chips.

SUMMARY OF THE INVENTION

The object of the invention is achieved by the method according to claim 1, and by the VCSEL module according to claim 15.

According to the invention, a method of the above-mentioned kind comprises the steps of:
dividing the VCSEL chip into a plurality of subarrays with at least one VCSEL unit each,
electrically connecting at least some of the subarrays in series.

In this context, the following definitions are given, which are valid throughout this application:

"VCSEL" refers to a vertical-cavity surface emitting laser, i.e. a type of semiconductor laser diode with laser beam emission perpendicular from an emitting surface. The laser diode comprises a resonator which consists of two distributed Bragg reflector DBR mirrors parallel to a wafer surface with an active (light-emitting) region consisting of one or more quantum wells for the laser light generation in between. The planar DBR-mirrors consist of layers with alternating high and low refractive indices. Each layer normally has a thickness of a quarter of the laser wavelength in the material, yielding intensity reflectivities above 99%.

The term "VCSEL unit" refers to a single laser light emitting element bounded by a boundary along a surface which light emitting element emits light in operation while the adjacent region of the surface across the boundary does not. It can therefore also be labelled as a single mesa along the surface which mesa emits light in operation.

A "VCSEL module" may comprise one or several VCSEL chips and possibly other elements such as a (submount) printed circuit board onto which VCSEL chips are contacted. In the context of this description and of the claims, the term "VCSEL module" is thus also used as a synonym for a single VCSEL chip on its own, whether it be assembled on a submount structure such as a circuit board or not.

The first doped layer and the second doped layer can also be characterized as the p-layer and the n-layer of the VCSEL chip. As both p-layer or n-layer can permit laser light to pass, these two doped layers are referred to as first and second doped layers. Often, a n-layer is positioned facing towards the lower side of the VCSEL chip and a p-layer is positioned facing towards the upper side of the chip, as will also be shown in the figures. The two types of doped (semiconductor) layers are to be understood to be layers of different type, i.e. if the first doped layer is the n-layer, then the second doped layer will be the p-layer and vice versa.

According to the invention, a VCSEL chip is now divided into so-called subarrays. These are characterized by the fact that the first doped layers of different subarrays amongst themselves and the second doped layers of different subarrays amongst themselves are not directly electrically connected. Rather, the subarrays are in series, which means that a first doped layer of one subarray is electrically connected to a second doped layer of a neighbouring, i.e. adjacent, subarray. These two subarrays are thus brought into a serial circuit.

By this measure, the overall current necessary to run all the VCSEL units of one VCSEL chip can be substantially reduced, namely by a factor which is essentially equal to the number of subarrays in series. Thus, the maximum operation current $I_{max}$ of a chip (for instance 40 A for a chip of the size of 3×3 mm) can be reduced to $I_{max}/n$, with n being the number of subarrays in series. Compared to the previous technique of mounting n smaller chips in series on a submount with, for instance, n=4, a reduction of 75% of all solder steps can be achieved. Further, placement steps can be simplified and wire-bonding can be virtually eliminated To conclude, this measure makes it possible to mount a lot more VCSEL units on one chip without going over the limits of the overall VCSEL system, in particular the driver and the electrical connections. The size of VCSEL chips can be increased substantially, which makes the mounting process more convenient and even safer: Larger VCSEL chips means that less chips need to be mounted to achieve the same laser performance and thus less work and less solder connections are necessary. In addition, the necessary wafer area of the VCSEL chip is smaller due to a reduction of sawing lanes, as is the overall area of the entire VCSEL module as there are less air gaps between individual VCSEL chips.

A VCSEL module according to the invention can be manufactured by the above-described process according to the invention. It is thus divided into a plurality of subarrays with at least one VCSEL unit each, at least some of which subarrays are electrically connected in series. It may be noted that a VCSEL chip may comprise other functional units which do not comprise a VCSEL unit. Such units are not considered to be subarrays in this context.

The dependent claims and the following description disclose particularly advantageous embodiments and features of the invention. Features of the claims may be combined as appropriate to arrive at further embodiment. Features described in the context of one claim category can apply equally to another claim category.

Preferably, in between two (adjacent) subarrays there are provided insulations between both the first doped layers of the two subarrays and between the second doped layers of the two subarrays. The serial connection between the two subarrays is thus provided solely between the first doped layer of one subarray and the second doped layer of the other subarray. It is thus the electrical insulation between the two first doped layers and between the second doped layers of the two subarrays which divides these two from each other. A "subarray" can thus be defined accordingly.

According to a particularly advantageous embodiment of the invention, both the first doped layer and the second doped layer of a subarray are contacted from the lower side. This implies that the VCSEL chip can be assembled or mounted to a board such as an electric circuit board, without complicated additional measures to provide the electrical contact that drives the VCSEL chip. For good thermal contact the board preferably comprises of a material with a good thermal constant and the VCSEL chips need to be soldered to these. In the case of series connection this means that there are preferably electrically insulated regions on the board to solder the individual subarrays. If the subarrays are so small that solder pre-forms are difficult to use it is particularly convenient to use pre-applied solder on these areas. Therefore, the invention also concerns a VCSEL module soldered to a board with one, preferably all of these mentioned features. If in contrast, both, the first and second doped layers, were contacted from the upper side (i.e. that surface through which light is emitted) or from somewhere in between the upper side and the lower side, additional and rather complicated contacting measures would need to be taken. The same also applies to any variations in which only one of the two doped layers is contacted from the lower side and the other one from somewhere else.

It is further particularly advantageous if the first doped layer of a first subarray is contacted to the second doped layer of a second, i.e. neighbouring, subarray through a via which is electrically insulated from the second doped layer of the first subarray. The expression "via" in this context is used as a synonym for a through-connection in the context of the invention The via provides for a simple through-connection from the lower side in the direction of the upper side and connects the two subarrays in series, thereby passing the plane in which the first doped layer is situated. For that reason, the first doped layer may only be in contact with the via from one subarray whilst the neighbouring first doped layer from the other subarray is electrically insulated from the via.

In this context, a highly advantageous procedure of producing the via is preferred. This procedure comprises the following steps:

a) providing an intermediate substrate with a first surface and a second surface on which second surface at least the following layers are deposited in the following order in order to form a semi-finished VCSEL product:
- a first doped layer plane, possible with a buffer layer for easified electrical contact between the intermediate substrate and the first doped layer plane,
- a light-emitting layer plane,
- a second doped layer plane.

Here, a standard vertical structure of a VCSEL chip is used as the product from which the process starts. Such standard structure may be provided as it is as a readily-available material composite or may be fully or partially produced by a coating process in which the above-mentioned layer planes (and possibly additional ones) are for instance epitaxially grown on the intermediate substrate. The intermediate substrate may for instance be a film or foil or wafer of GaAs as would normally be used for VCSEL products as well.

b) structuring the light-emitting layer plane and the second doped layer plane such that their extensions define extensions of a number of VCSEL units. In this step the mesas are defined, i.e. both the light-emitting layer plane and the second doped layer plane are tailored such that their extensions (i.e. the extensions of at least one of the two structured planes) are essentially equal to the extension of VCSEL units or mesas.

c) providing a structured electrically conductive contact structure for electrically contacting the second doped layer (in particular of a subarray) at an upper side of the second doped layer plane facing away from the intermediate substrate. In this step the upper side contacts for the upper doped layer plane are provided.

d) adding a transparent carrier material at the upper side of the second doped layer plane. This carrier material, an example of which will be explained later, can define the surface through which the light of the VCSEL units will be emitted, which surface can be characterized as an output coupling facet. It protects the layers below in the direction of the intermediate layer and also takes over the function of a carrier from the intermediate substrate, which had this carrier function before.

e) removing the intermediate substrate at least locally, preferably completely, along its principal extension. The removal of the intermediate substrate must be carried out in the region in which the via is to be placed. As the carrier material has taken over the function of carrier from the intermediate substrate, the intermediate substrate can be removed completely, if wished for, but also be left in place partially. A complete removal is particularly advantageous because this way the surface of the first layer which has not been removed together with the intermediate substrate is essentially plane, which makes contacting the VCSEL chip easier later.

f) producing the via. The via can now be introduced from that side at which previously the intermediate substrate had been situated, i.e. from the lower side of the VCSEL chip (i.e. of the semi-finished product for producing the VCSEL chip). This via production is preferably accomplished by an etching process.

This method can be used particularly advantageously in the context of the above-described method according to the invention. However, it can generally be used for producing vias in the manufacture of any VCSEL module comprising at least one VCSEL chip with an upper side and a lower side and with a plurality of VCSEL units on a common carrier structure, the VCSEL units comprising a first doped layer of a first type facing towards the lower side and a second doped layer of a second type facing towards the upper side, whereby a via is produced. This via will then connect the second doped layer to the lower side. Accordingly, the invention also generally concerns such method and also a VCSEL module produced according to such method.

Because the structured electrically conductive contact structure is provided at that side of the semi-finished product facing away from the intermediate substrate, the lower side of the VCSEL device can be designed virtually planar. This makes contacting particularly easy in that it allows creating contact to the first and second doped layer on the same side allowing surface mounted device assembly. In addition, the absence of the intermediate substrate which would be the normal carrier substrate according to the state of the art has the advantage of a reduction of thermal resistance on that side of the VCSEL chip. Therefore, heat generated in the operation of the VCSEL chip can be transported away at its lower side much easier than in the state of the art. Furthermore, the VCSEL chip produced according to this general principle as outlined in the previous paragraph can serve as an alternative to the following two principles:

a) flip chip mounting of so-called bottom emitter VCSEL modules: this principle is based on emitting laser light through the lower side of a VCSEL module, i.e. such side which comprises a carrier material, for instance of GaAs, on which the other functional VCSEL layer planes (i.e. the first doped layer plane, the light-emitting layer plane and the second doped layer plane) have been deposited. The laser light thus passes the carrier material. This principle has the limitation that the carrier material does not transmit laser light of all wavelengths GaAs for instance is intransparent for wavelengths below 920 nm.

b) the removal of a carrier material such as GaAs after the deposit of the above-mentioned layer planes without providing another carrier material at the upper side of the VCSEL chip has the drawback that the mechanical construction of the VCSEL chip becomes weak.

These drawbacks are circumvented by the alternative provided by the invention, which is thus particularly advantageous both concerning the production process and the handling of the VCSEL chip/module during mounting and/or operation.

In addition, for producing the via in step f) a structured contact layer can be deposited at a side of the carrier material opposite of the upper side. This structured contact layer is preferably (in the context of the manufacture of a VCSEL with subarrays in series) structured such that it comprises a first region, which is in electrical contact with the first doped layer of one subarray and a second region which is in electrical contact with the second doped layer of the same subarray. The first region and the second region of the structured contact layer of one subarray are thereby electrically insulated from each other: the structured contact layer is essentially divided into two regions for contacting the first doped layer and the second doped layer. These regions can be used in a soldering process to act as contact areas for mounting of the chip and electrically contacting it to a circuit board below. In this context, it may be noted that in the case of a serial connection of subarrays only one contact area at a first subarray and another contact area at a last subarray of the series need to be electrically contacted to a circuit board. All other contact areas need to be electrically insulated from the circuit board but soldered to it for a thermal contact in order to cool down the VCSEL chip during operation. The second region of the structured contact layer can be considered the electrical connection of the via and provides the electrical contact to the second doped layer.

Preferably, there is deposited an insulating layer in the via, in the context of the manufacture of a VCSEL with subarrays in series the insulating layer is deposited in between the first doped layer and the second region of the structured contact layer. This generally serves to insulate the via from the first doped layer (in particular of the same subarray). Because the via extends through the plane of the first doped layer (plane) such additional insulating layer is an effective means of how to prevent a short circuit between the first and second doped layer (planes) in particular within the same subarray.

It is further preferred that the electrically conductive contact structure is structured such that it is divided along its principal extension (i.e. along its main plane) into a plurality of individual conductive contact structures electrically insulated from each other. These individual conductive contact structures can then (in the context of the manufacture of a VCSEL with subarrays in series) each define a contact region of one subarray. In other words, the electrically conductive contact structure is divided along its principal extension such that each individual conductive contact structure is assigned to one subarray. By electrically insulating these individual contact structures from one another a division of the contacts of the second doped layers of the subarrays is achieved.

In step a) there is preferably also provided an etch-stop layer between the first doped layer plane and the intermediate substrate. This etch-stop layer serves to stop an etching process in which the intermediate substrate is etched away at a defined surface, namely the surface of the etch-stop layer. The etch-stop layer itself can later be removed in an additional removing process, preferably by an etchant which due to its chemical and/or physical properties essentially does not etch the first doped layer plane.

Preferably any selective, i.e. structured deposition of layers is preferably carried out by using photolithography. In contrast, the partial or full-scale removal of layers is preferably achieved by etching. In this context it must be considered that the structures of a VCSEL chip are aligned with an exactness in the range of two to five $\mu m$, depending on whether the semi-finished VCSEL product is treated exclusively from one side or from either sides. This means that for instance on a VCSEL chip of a size of 2×2 mm the number of 3300 VCSEL units can be assembled. That implies that for removal of regions in a layer etching or laser ablation technologies (which however implies more effort and time, which is why etching is preferred) are most preferred due to their exactness, the same applies to photolithographic selective deposition of layers.

As for the removal of the intermediate layer, this can be carried out by different techniques which can be used alternatively or preferably additionally.

According to the first technique, the intermediate substrate is also removed at least partially by etching. Such etching process is based on a well-established method and—in particular in connection with the above-mentioned use of an etch-stop layer—results in a well-defined surface after etching.

According to the second technique, the intermediate substrate is removed at least partially by a grinding process. Such grinding can be carried out faster and does not involve hazardous chemicals. It is thus particularly suited for removing larger thicknesses of material, as is the case with the intermediate substrate.

Preferably the two techniques are combined, so that most preferred the first removal process is a grinding process in which the main part of the material of the intermediate substrate is removed whereas the second removal process is an etching process which removes the remainders.

As for the carrier material, this preferably comprises a translucent material, preferably transparent a material that is transparent for the wavelength of the light emitted by the VCSEL units, in particular a wafer material. This material is further preferably provided with an anti-reflective coating to minimize outcoupling losses due to internal reflections. Through the surface of the carrier material the laser light is emitted so that light passes through the carrier material. Preferably, the translucent material comprises a glass substrate as this is a standardized material which can be obtained in virtually any desired thickness and quality and also be easily connected to the rest of the semi-finished VCSEL product. Glass is also a rigid material which is resistant to mechanical stress and which can be cut or diced with normal semiconductor sawing equipment.

The carrier material is preferably added to the rest of the semi-finished VCSEL product by a bonding, and/or filling process. A bonding process may for instance comprise a glueing process. Apart from glueing, other techniques such as direct bonding, (laser-selective) soldering, laser-assisted bonding, may be used. Use is thus made of a bonding, e.g. glueing and/or filling material which for instance fills lower regions, i.e. gaps, between the mesas of the VCSEL units so that the carrier material can be evenly applied to the semi-finished VCSEL product. At the same time, this material functions as a bonding means which connects the carrier material to the rest of the semi-finished VCSEL product. Thereby, it is preferred that the bonding and/or filling material used in the bonding and/or filling process has after curing essentially the same refractive index as the carrier material. This way it is made sure that no optical disturbances occur due to the bonding/filling material.

Additionally, the carrier material can be supplied with a number of micro-lenses at a carrier surface which faces away from the intermediate substrate. These micro-lenses essentially correspond in their position with the positions of the VCSEL units and can thus focus the emitted light from the VCSEL unit. A micro-lens is thus preferably positioned such that its centrepoint is essentially exactly above the centrepoint of a VCSEL unit to which it is assigned. Such micro-lenses may be applied before adding the carrier material but also later. This can be achieved by applying a countershape of the micro-lenses to the said carrier surface accompanied by heat and/or pressure. The micro-lenses may also be comprised of an additional layer deposited on the said carrier surface and shaped during curing of this additional layer.

As mentioned above, it is particularly advantageous for further contact steps if after removal of the intermediate substrate a substantially planar surface plane is provided at that side of the carrier material facing away from the upper side. Several measures to achieve this have been mentioned, amongst them the removal of the intermediate substrate up to an etch-stop layer and the deposition of the structured contact layer from above.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
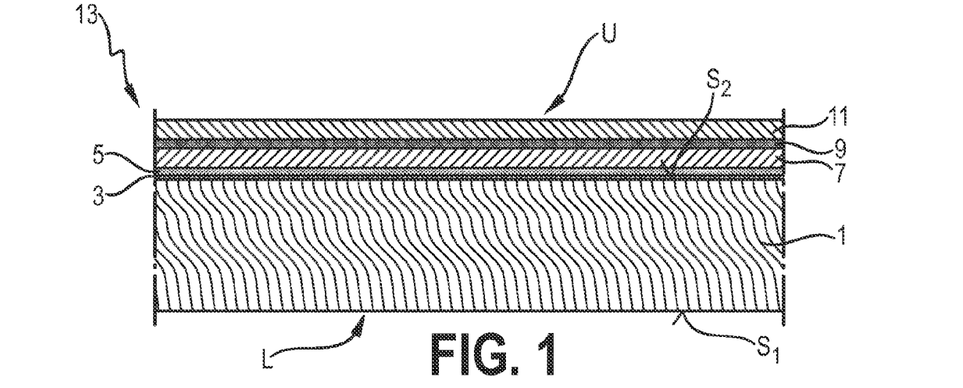
FIG. 1 shows a section view of part of a semi-finished VCSEL product for the production of a VCSEL chip according to the invention in a first production state.

FIG. 1 shows a part of a semi-finished VCSEL product 13 for the production of a VCSEL chip, i.e. also for a VCSEL module, according to an embodiment of the invention.

The semi-finished VCSEL product 13 has an upper side U and a lower side L. It comprises in the given order from the lower side L to the upper side U: an intermediate substrate 1 with a first, lower, surface $S_1$ and a second, upper, surface $S_2$, an etch-stop layer 3 on the second surface $S_2$, an electrically conductive buffer layer 5, a first doped layer plane 7, a light emitting layer plane 9 and a second doped layer plane 11. The first doped layer plane 7 and the second doped layer plane 11 will later function as mirrors to form the vertical cavity of the VCSEL chip. As they also need to serve as electrical contacts in this case they are made of layers with alternating refractive index, i.e. for instance GaAs or AlGaAs with thicknesses adapted to the emitted wavelength, for which purpose they are doped by Si and C.

In this embodiment the first doped layer plane 7 constitutes a semiconductor n-layer plane 7 whereas the second doped layer plane 11 constitutes a semiconductor p-layer plane 11.

The intermediate substrate 1 can comprise GaAs, typically of a thickness of 400 to 600 μm. The etch-stop layer 3 comprises a different material than the intermediate substrate 1. Its material is chosen such that wet or dry etchants which can typically be used to etch the material of the intermediate substrate 1 will affect the etch-stop layer less so that the etch rate of the etch-stop layer is substantially lower, i.e. at least half the etch rate of the intermediate substrate 1, preferably less than 90%. The buffer layer 5 acting as a contact layer can comprise GaAs again and is preferably very thin, namely less than 5 μm.

The n-layer plane 7 and the p-layer plane 11 are realized as doped distributed Bragg reflector layers so that when current flows from the n-type layer plane 7 to the p-type layer plane 11 the light-emitting layer plane 9 will emit light which is then reflected between the Bragg reflectors and selectively coupled out at the upper side U.

Figure 2:
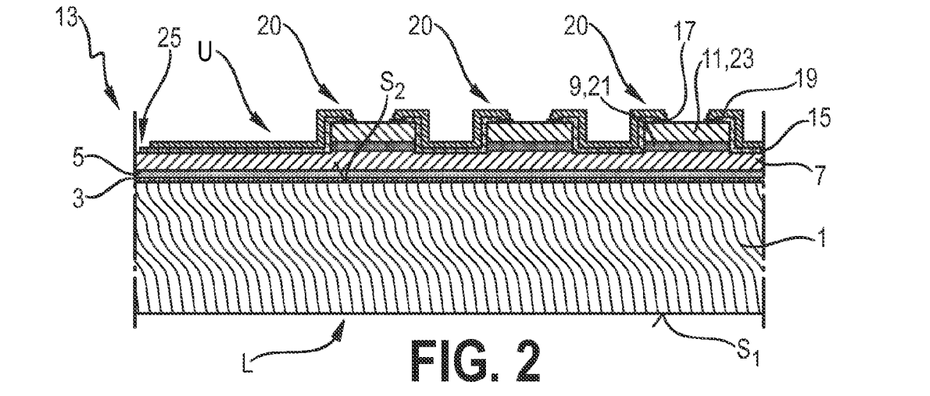
FIG. 2 shows a section view of the same part in a second production state.

FIG. 2 shows a second state of the semi-finished VCSEL product 13 after a few additional manufacturing steps: The light-emitting layer plane 9 and the p-layer plane 11 have now been locally removed to form three mesas 20 by means of a local etching process. For that purpose, an inline control of the results of the etching process has been used, either by controlling the time used for etching or by optical measurement techniques such as measuring the height of the remaining n-layer plane using a laser beam. The result is that the p-layer plane 11 and the light-emitting layer plane 9 are completely removed in the areas outside the mesas 20 whilst the n-layer plane 7 is only partially removed and remains an intact complete layer plane. In contrast, the light-emitting layer plane 9 has been divided into several light-emitting layers 21 and the p-type layer plane has been divided into several p-type layers 23 or second layers 23. The mesas 20 are thus formed in those regions in which both the light-emitting layers 21 and the p-type layers 23 are situated.

On top of the p-type layers 23 a ring contact 17 has then been deposited. This can also be done prior to the etching of the mesas 20. In general, a low-Ohmic contact to the p-type layers 23 (as indeed should be the case for the contacting of the n-type layer plane as well) is realized by choosing an according layer composition of the ring contact 17. This has been realized by means of a photolithographic process in which a photolithographic layer has been deposited over the entire upper side U of the semi-finished VCSEL product 13 and then developed in the region in which the ring contact 17 was to be placed. In this region, the photolithographic layer has then been removed, then a metallization process over the entire upper side U has been carried out and the remaining part of the lithographic layer has been washed away in a washing process in all those regions of the semi-finished VCSEL product 13 outside the region of the ring contact 17. The metallization thus only remains in this very region the ring contact 17 is thus a local ring-shaped metallization on top of the p-type layers 23.

After the deposition of the ring contact 17 an insulating layer 15 for instance of polyamide, silicon oxide or silicon nitride has been deposited over the p-layer plane 7 and that part of the p-type layers 23 reaching from their outer edge up to the ring contacts 17. The insulating layer has been deposited using another lithographic process, possibly accompanied by an etching process. The insulating layer 15 thus covers all of the semi-finished VCSEL product 13 on the upper side U in this step apart from that region of the mesas 20 through which the laser light will later be coupled out and part of the ring-shaped contact 17.

Lastly, it can be seen in FIG. 2 that a structured electrically conductive contact structure 19 has been deposited over insulating layer 15, again using a lithographic process accompanied by a vapour deposition of the metal electrically conductive contact structure 19 which contact structure 19 has a low-resistance, i.e. metallic contact to the ring contact 17. The light-emitting region in the mesas 20 is uncovered also by this electrically conductive contact structure 19, as well as a small gap 25, which can be seen at the left-hand side of the figure. It may be noted in this context that both to the left and to the right of this part of the semi-finished VCSEL product 13 more parts of the same or a similar make and structures may be aligned. The part depicted in FIGS. 1 to 5 thus only shows the construction of one single subarray of a VCSEL chip. The small gap 25 thereby serves to separate the structured electrically conductive contact structure 19 of one subarray from that of the neighbouring one, so that several individual conductive contact structures are the result (cf. FIG. 6).

Figure 3:
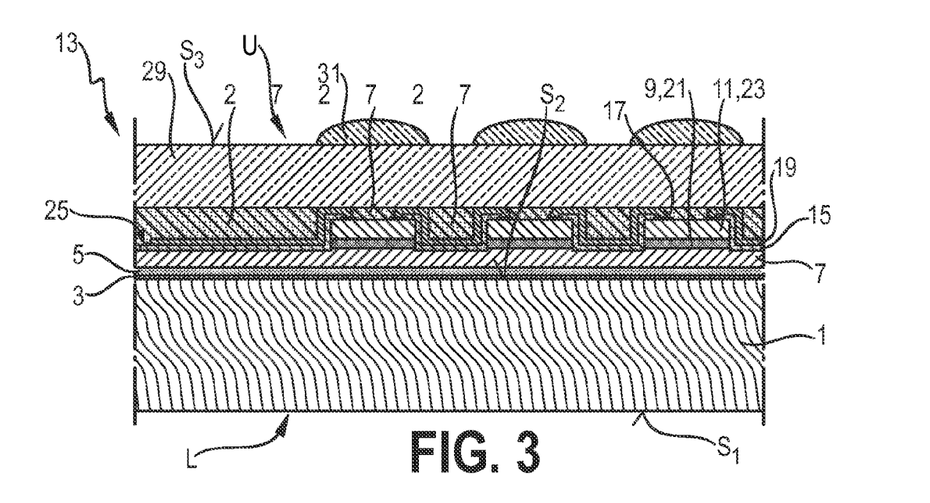
FIG. 3 shows a section view of the same part in a third production state.

FIG. 3 shows the semi-finished VCSEL product 13 in a next state of production: Now, a transparent carrier substrate 29, here a glass wafer 29 of a thickness of 200 to 1000 µm, has been added to the upper side of the semi-finished VCSEL product 13 and adhered to it by means of a filling and bonding material 27. The filling and bonding material 27 both adheres to the glass wafer 29 to the other layers below of the semi-finished VCSEL product 13 and also fills the gaps between the mesas 20. After curing, the filling and bonding material 27 has essentially the same refractive index as the glass wafer 29 above it so that it does not produce any optical disturbances.

On the upper surface $S_3$ of the glass wafer 29 facing away from the intermediate substrate 1, an array of micro-lenses 31 is arranged, which micro-lenses 31 are placed above the mesas 20 so as to focus and/or to collimate the laser light coming from the mesas 20 in operation.

Figure 4:
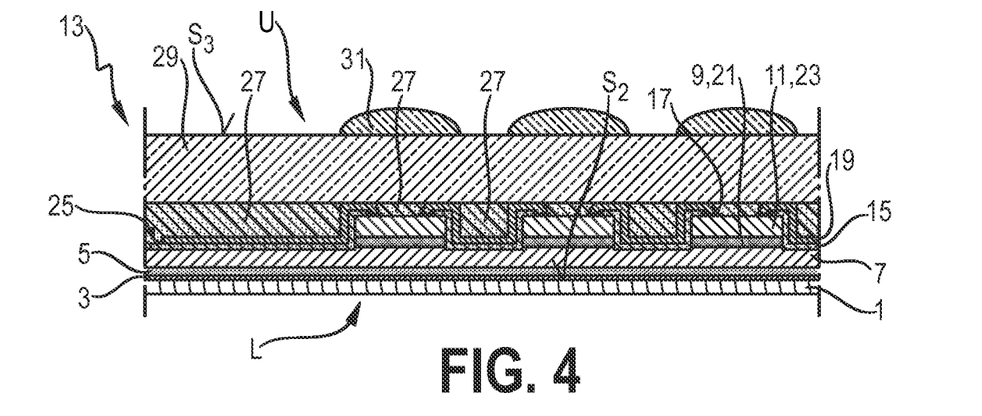
FIG. 4 shows a section view of the same part in a fourth production state.

FIG. 4 shows the semi-finished VCSEL product 13 while the intermediate substrate 1 is being removed: in a first step its thickness has been substantially reduced by a grinding process. However, this back-grinding process ends before the etch-stop layer 3 is reached and exposed. The remainder of the intermediate substrate 1 is then removed by etching (not shown).

Figure 5:
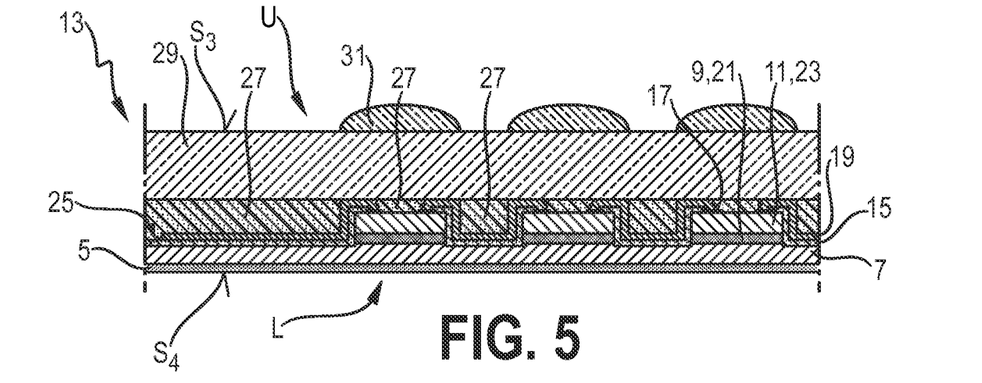
FIG. 5 shows a section view of the same part in a fifth production state.

FIG. 5 shows the semi-finished VCSEL product 13 after the etch-stop layer 3 has also been removed so that now the buffer layer 5 is exposed with a substantially planar surface plane $S_4$. Instead of the intermediate substrate 1 which is now completely removed, the carrier material 29 carries the complete semi-finished VCSEL product 13.

Figure 6:
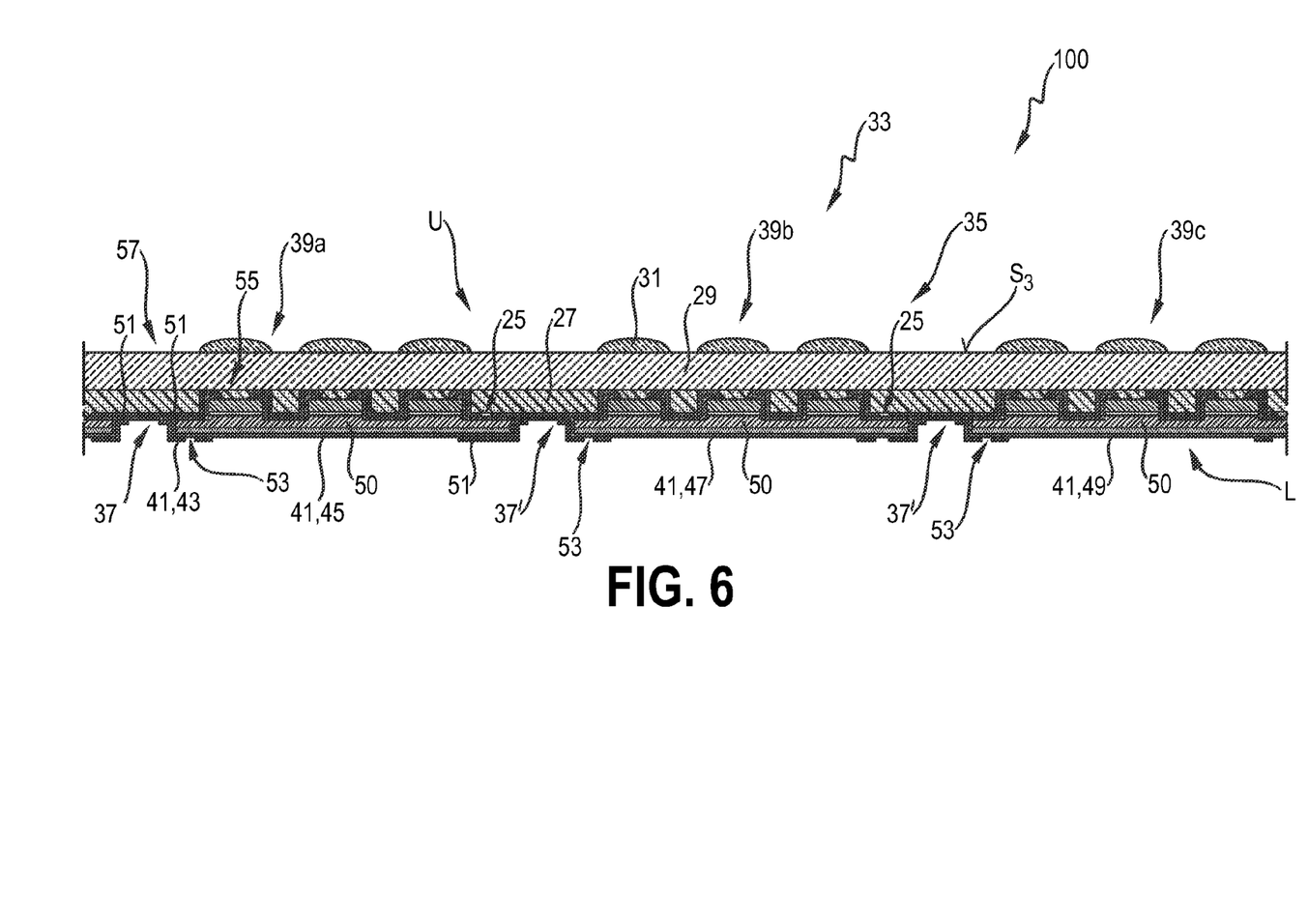
FIG. 6 shows a section view of a VCSEL chip according to a first embodiment of the invention.

FIG. 6 shows a complete VCSEL chip 33 according to an embodiment of the invention. Several subarrays 39a, 39b, 39c are shown which have all been preproduced in the way as explained with reference to the previous figures. In order to complete the contact structures and to divide the VCSEL chip 100 into subarrays 39a, 39b, 39c several additional steps have been necessary:

Vias 37, 37' have been produced, whereby the left via 37 does not serve to connect the left subarray 39a to another subarray. The other two vias 37' do connect the subarrays 39b, 39c in the middle and at the right-hand side to the neighbouring subarrays 39a, 39b to their left.

The vias 37, 37' have been produced by an etching process, namely by so-called reactive ion etching, i.e. a dry etching process using ionized gas as an etchant. Before that etching process, a protective lacquer layer has been deposited on the surface $S_4$ of the buffer layer 5 (cf. FIG. 5). The vias 37, 37' are then etched through the buffer layer 5, the n-layer plane 7 and the insulating layer 15. Alternatively, the insulation layer 15 can also be structured, such that there is no insulation layer 15 in the area of where the vias 37, 37' will be produced. The etchant is chosen such that it does not affect the individual conductive contact structures 19a, 19b, 19c so that these remain essentially unetched. The result is that each subarray 39a, 39b 39c comprises one n-type layer or first type layer 50 produced from the n-type layer plane 7 which has now been separated by the vias 37, 37'. For this processing step, there can also be an additional etch stop layer between the buffer layer 5 and the n-type layer 7 or between the n-type layer 7 and the active layer 9. Additionally during this step of producing the vias 37, 37', a trench can be etched around each subarray 39a, 39b, 39c to prevent a shortcut through the buffer layer 5 and the n-type layer plane 7. For separation purposes, e.g. by sawing along some of the subarrays one creates normally so-called scribe lanes where all layers of the VCSEL chip 33 are removed to avoid so-called "chipping" on the VCSEL chip's edge and peeling of layers in this region. Therefore preferably all deposited layers preferably except for the insulation layer 51 are removed.

Next, an insulation material 51 has been provided which bridges the region of the vias 37, 37' between the individual conductive contact structures 19a, 19b, 19c via the n-type layers, the n-type layers 50 and the buffer layers 5 (which have also been separated analogously as the n-type layer plane 7). However, the insulation material does not cover the entirety of the planar surface $S_4$ of the buffer layer, but rather a small part of it.

In a last lithographic deposition process a structured contact layer 41 has been deposited at the lower side L of the VCSEL chip 33. This contact layer 41 is structured such that it comprises several separate contact regions 43, 45, 47, 49 separated from each other by gaps 53. The first contact region 43 permits an electric contact with the p-type layer 23 of the first subarray 39a. The second contact region 45 electrically connects the n-type layer 50 of the first subarray 39a with the p-type layer 23 of the second, i.e. neighbouring, subarray 39b. The third contact region 47 electrically connects the n-type layer 50 of the second subarray 39a with the p-type layer 23 of the third subarray 39c. The fourth contact region 49 permits an electric contact with the n-type layer 23 of the third subarray 39c. In other words: by contacting the VCSEL chip 33 at the left via the first contact region 43 with a first pole of a power source and at the right via the fourth contact region 49 with a second pole of the power source, a current of the correct polarity will flow through all VCSEL units 55 which have been defined by the mesas 20. Thereby, current will flow in parallel through the VCSEL units 55 of each one of the subarrays 39a, 39b, 39c, whereas the subarrays 39a, 39b, 39c amongst themselves have been put into series, which reduces the amount of the current by a third in this case with three subarrays 39a, 39b, 39c.

In between a gap 25 of the structured electrically conductive contact structure 19 and gap 53 of the structured contact layer 41 there lies an insulating region 57 in which the operation of VCSEL units 55 is not possible. This insulating or passive region 57 serves as a contact region for the vias 37, 37' and as a division region between the subarrays 39a, 39b, 39c.

It may be noted that at the left of the VCSEL chip 33, the via 37 is realized such that exclusively a contact to the p-type layer 23 is made possible. Therefore this via 37 constitutes the starting contact of the VCSEL chip 33, whereas at the right-hand side, additional subarrays may be arranged.

Figure 7:
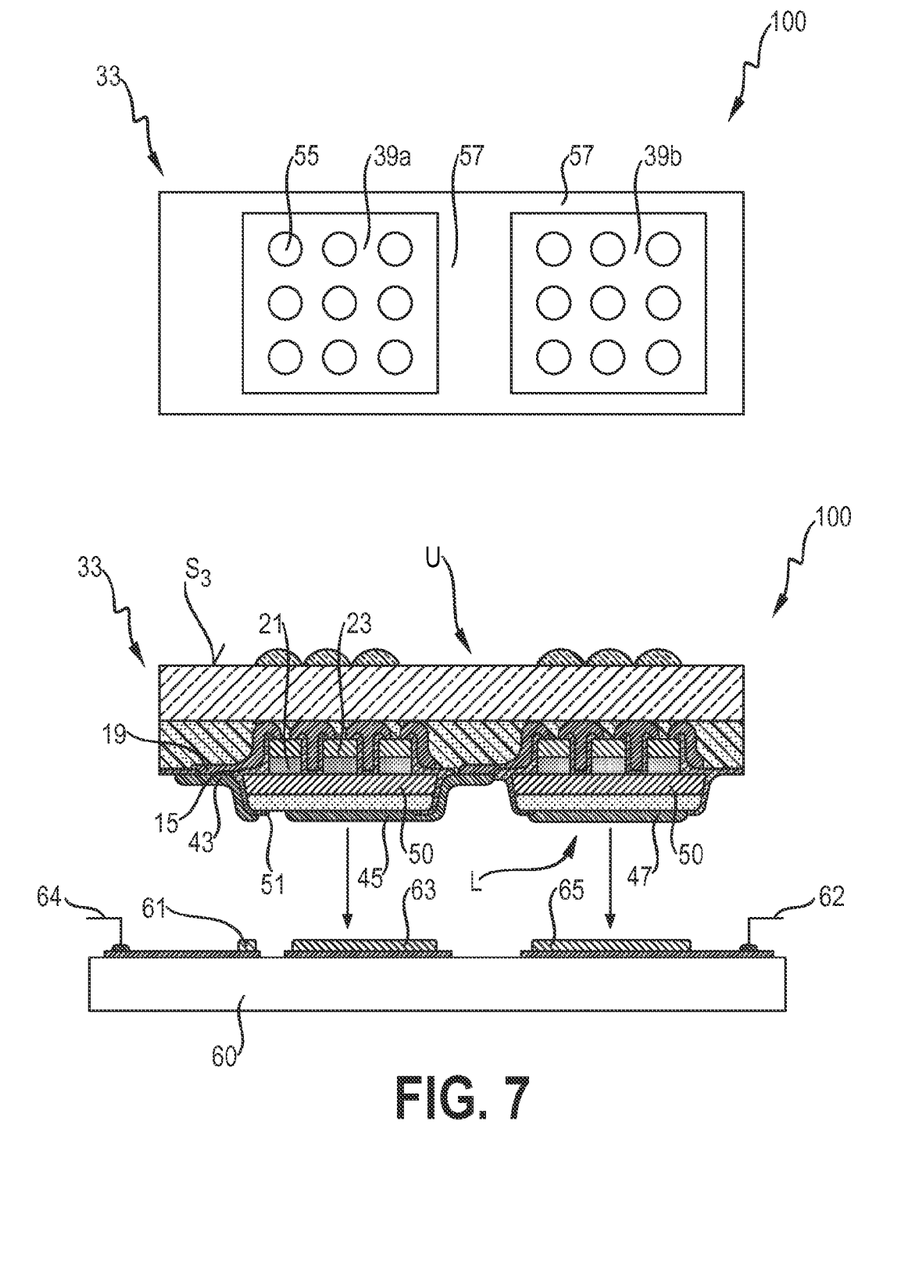
FIG. 7 shows a section view of a VCSEL chip according to a second embodiment of the invention.

FIG. 7 shows a VCSEL chip 33 of a VCSEL module 100 according to an embodiment of the invention in top view and in a section view. The VCSEL chip 33 comprises two subarrays 39a, 39b separated from and at the same time serially connected to each other in the same way as shown with reference to the previous figures. In between the subarrays 39a, 39b and all along their circumference there are insulating regions 57 as described with reference to FIG. 6. In the section view the alignment of which corresponds to the top view there is also shown a submount printed circuit board 60 with metal pad contacts 61, 63, 65 which are equipped with solder for contacting the corresponding contact regions 43, 45, 47 of the VCSEL chip 33 above. The left metal pad contact 61 and the right metal pad contact 65, i.e. the outermost metal pad contacts 61, 65 are also contacted via wires 64, 62 to the two poles of a power source (not shown). Therefore, by soldering the VCSEL chip 33 with its two subarrays 39a, 39b to the submount printed circuit board 60, a VCSEL module 100 according to the invention is produced.

Figure 8:
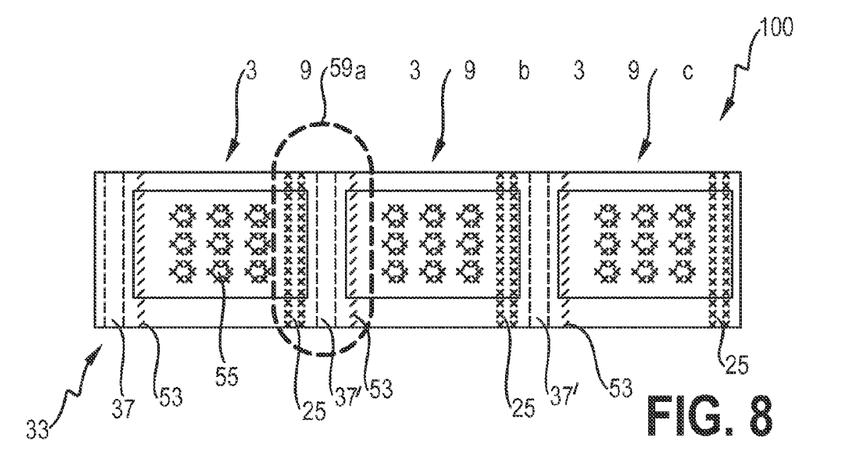
FIG. 8 shows a top view of the VCSEL chip of FIG. 6.

FIG. 8 shows the VCSEL chip 33 of FIG. 6 in a top view in which some of the elements of the chip structure below are depicted, namely the VCSEL units 55, the vias 37' and the gaps 25, 53 which separate the contact regions 43, 45, 47, 49 and the individual conductive contact structures 19a, 19b, 19c. It can be observed that the vias 37' and the gaps 25, 53 run all along the length of the border between the subarrays 39a, 39b, 39c. They constitute together a circuit connection region 59 which serves to put the subarrays 39a, 39b, 39c into a serial circuit.

Figure 9:
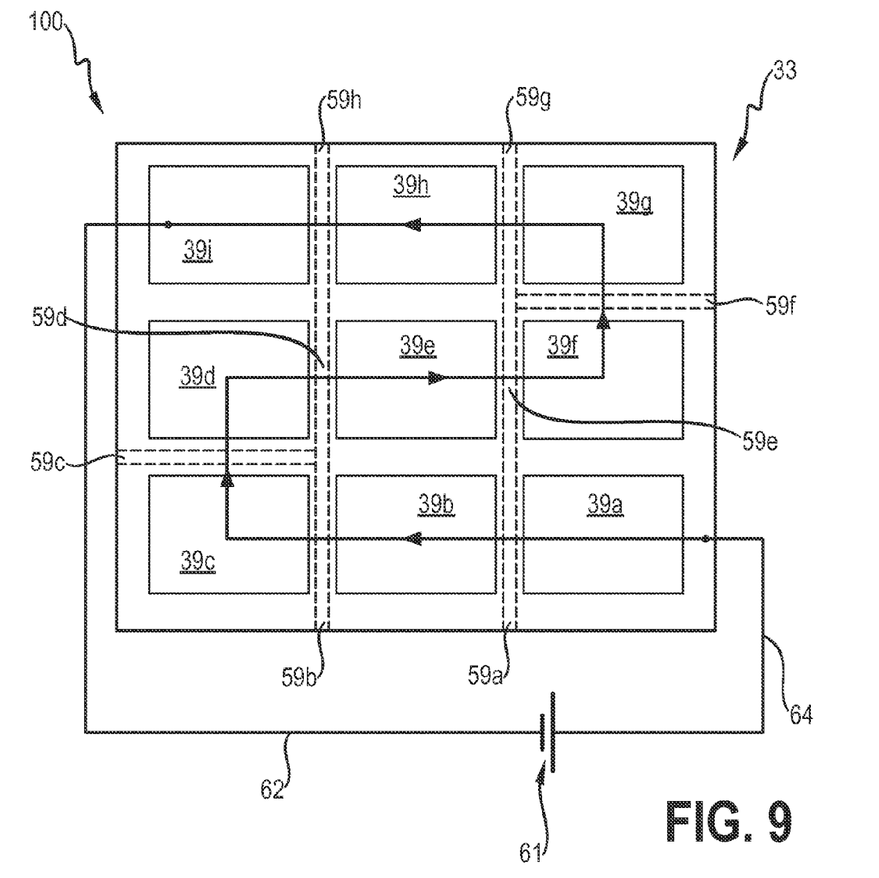
FIG. 9 shows a top view of a VCSEL chip according to a third embodiment of the invention.

Such circuit connection regions 59 need to be arranged in between any subarrays of a VCSEL chip 33 which are put in series. Thereby, the location of circuit connection regions 59 need not necessarily be only along one straight line as is the case in the embodiment of FIG. 8. Rather, as shown in FIG. 9, such serial connection can also be realized in a more complicated arrangement of subarrays 39a, 39b, 39c, 39d, 39e, 39f, 39g, 39h, 39i in which the serial connection between the subarrays 39a, 39b, 39c, 39d, 39e, 39f, 39g, 39h, 39i has a winding shape. The subarrays 39a, 39b, 39c, 39d, 39e, 39f, 39g, 39h, 39i are interconnected by circuit connection regions 59a, 59b, 59c, 59d, 59e, 59f, 59g, 59h. Whilst the lowest first three subarrays 39a, 39b, 39c are aligned along a straight line from right to left with the first two circuit connection regions 59a, 59b in between them, the third circuit connection region 59c is directed perpendicularly to the previous two and provides a contact in an upwards direction to the fourth subarray 39d. From there on, the contacts of the next subarrays 39d, 39e, 39f go along another straight line from left to right where again an upwards contact via the sixth circuit connection region 59f is realized. Therefore, from the power source 67 via the contact wires 59, 62 the VCSEL chip 33 and thus the VCSEL module 100 is contacted and then current runs in series along all the subarrays 39a, 39b, 39c, 39d, 39e, 39f, 39g, 39h, 39i whether they be connected in a side-by-side fashion or from one row to the next.

Generally, circuit connection regions 59 can be arranged in an orientation along interconnected rows as is the case here, but also along interconnected columns or indeed along more complicated meander shapes or the like, which mainly depends on the best contact spots and on the overall shape of the individual VCSEL chip.

Although the present invention has been disclosed in the form of preferred embodiments and variations thereon, it will be understood that numerous additional modifications and variations could be made thereto without departing from the scope of the invention. For example, a VCSEL chip according to the invention may comprise many more layers and a VCSEL module according to the invention often comprises several VCSEL chips connected in parallel or in series. In addition, some subarrays may also be connected in parallel rather than in series.

For the sake of clarity, it is to be understood that the use of "a" or "an" throughout this application does not exclude a plurality, and "comprising" does not exclude other steps or elements.

The invention claimed is:

1. A method of manufacturing a VCSEL module comprising at least one VCSEL chip with an upper side and a lower side and with a plurality of VCSEL units on a common carrier structure, the VCSEL units comprising a first doped layer of a first type facing towards the lower side and a second doped layer of a second type facing towards the upper side, which method comprises the steps of:
dividing the VCSEL chip into a plurality of subarrays, the plurality of subarrays including a first subarray and a second subarray, with at least one VCSEL unit each,
electrically connecting at least a portion of the plurality of subarrays in series,
wherein the first doped layer of the first subarray is connected to the second doped layer of the second subarray through a via which is electrically insulated from the second doped layer of the first subarray,
wherein the via is produced by the following steps:
providing an intermediate substrate with a first surface and a second surface on which second surface at least the following layers are deposited in the following order in order to form a semi-finished VCSEL product comprising:
a first doped layer plane;
a light emitting layer plane; and
a second doped layer plane, structuring the light-emitting layer plane and the second doped layer plane such that their extensions define a number of VCSEL units, providing a structured electrically conductive contact structure for electrically contacting the second doped layer at an upper side of the second doped layer plane facing away from the intermediate substrate, adding a carrier material at the upper side of the second doped layer plane, whereby the carrier material comprises a translucent material, that is transparent for the wavelength of the light emitted by the VCSEL units, such that the carrier material defines a surface through which the light of the VCSEL units will be emitted, removing at least a portion of the intermediate substrate, producing the via by etching through the first doped layer plane to expose the structured electrically conductive contact structure.

2. The method according to claim 1, wherein in between at least two of the plurality of subarrays there is insulation between the first doped layers and the second doped layers of the at least two of the plurality of subarrays.

3. The method according to claim 1, wherein the first doped layer and the second doped layer of a selected subarray of the plurality of subarrays is contacted from the lower side.

4. The method according to claim 1,
wherein a structured contact layer is deposited at a side of the carrier material opposite of the upper side, the structured contact layer arranged such that it comprises a first region, which is in electrical contact with the first doped layer of at least one subarray and a second region which is in electrical contact with the second doped layer of the at least one subarray,
wherein the first region is insulated from the second region.

5. The method according to claim 4, wherein the via comprises an insulating layer.

6. The method according to claim 1, wherein the electrically conductive contact structure is arranged such that it is divided into a plurality of individual conductive contact structures electrically insulated from each other.

7. The method according to claim 1, wherein between the first doped layer plane and the intermediate substrate there is provided an etch-stop layer.

8. The method according to claim 1, wherein the carrier material is attached by a bonding and/or filling process.

9. The method according to claim 8, wherein a bonding and/or filling material used in the bonding and/or filling process has after curing essentially the same refractive index as the carrier material.

10. The method according to claim 1, wherein the carrier material is supplied with a number of micro-lenses at a carrier surface which faces away from the intermediate substrate.

* * * * *